(12) United States Patent
Kosaka et al.

(10) Patent No.: US 9,368,405 B2
(45) Date of Patent: Jun. 14, 2016

(54) METHOD FOR MANUFACTURING SEMICONDUCTOR DEVICE

(71) Applicant: Sumitomo Electric Device Innovations, Inc., Yokoahama-shi (JP)

(72) Inventors: Toshiyuki Kosaka, Yokohama (JP); Hiroshi Kawakubo, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 14/608,879

(22) Filed: Jan. 29, 2015

(65) Prior Publication Data
US 2015/0221554 A1     Aug. 6, 2015

(30) Foreign Application Priority Data
Jan. 31, 2014   (JP) ................. 2014-016990

(51) Int. Cl.
| | |
|---|---|
| *H01L 21/78* | (2006.01) |
| *H01L 21/683* | (2006.01) |
| *H01L 21/768* | (2006.01) |
| *H01L 21/268* | (2006.01) |
| *H01L 21/306* | (2006.01) |
| *H01L 29/20* | (2006.01) |

(52) U.S. Cl.
CPC .............. *H01L 21/78* (2013.01); *H01L 21/268* (2013.01); *H01L 21/30621* (2013.01); *H01L 21/6835* (2013.01); *H01L 21/6836* (2013.01); *H01L 21/76898* (2013.01); *H01L 29/2003* (2013.01); *H01L 2221/6834* (2013.01); *H01L 2221/68327* (2013.01); *H01L 2221/68381* (2013.01)

(58) Field of Classification Search
CPC ..................... H01L 21/3043; H01L 21/30604; H01L 21/302; H01L 21/67086; H01L 21/78; H01L 21/6835; H01L 21/6836; H01L 21/68327
USPC ........................... 438/462–464; 257/620, 622
See application file for complete search history.

(56) References Cited

U.S. PATENT DOCUMENTS

| | | | | |
|---|---|---|---|---|
| 8,536,709 | B1 * | 9/2013 | Hsu ...................... | H01L 22/14 257/764 |
| 8,697,542 | B2 * | 4/2014 | Pascual ............... | H01L 21/6835 257/774 |
| 2004/0121618 | A1 * | 6/2004 | Moore ................... | C09J 193/04 438/782 |

FOREIGN PATENT DOCUMENTS

| | | |
|---|---|---|
| JP | 03-166750 A | 7/1991 |
| JP | 11-026403 A | 1/1999 |
| JP | 2002-025948 A | 1/2002 |

* cited by examiner

*Primary Examiner* — Karen Kusumakar
(74) *Attorney, Agent, or Firm* — Venable LLP; Michael A. Sartori; Laura G. Remus

(57) ABSTRACT

A method for manufacturing a semiconductor device that includes steps of: (1) adhering a support substrate to a first surface of a wafer using an adhesive, the wafer including first and second scribe lines extending along first and second directions, respectively, (2) thinning the wafer, (3) forming a groove in a first scribe line excluding a region located in an outer peripheral portion of the wafer, the groove piercing the wafer from the first surface to a second surface opposite to the first surface to expose the adhesive, the first scribe line and the second scribe line demarcating chip regions; and (4) removing the adhesive by immersing the wafer adhered to the support substrate in a solvent such that the solvent permeates into the groove.

12 Claims, 8 Drawing Sheets

--PRIOR ART--

--PRIOR ART--

METHOD FOR MANUFACTURING SEMICONDUCTOR DEVICE

BACKGROUND OF THE INVENTION

1. Field of the Invention

The present invention relates to a method for manufacturing a semiconductor device.

2. Related Background Art

A chip included in a semiconductor device is formed by cutting a wafer. Also, from a viewpoint of reduction of thermal resistance, the wafer is thinned by grinding the back surface thereof. In such processes of cutting and grinding, the wafer is reinforced by a support such as a substrate or a tape (Japanese Patent Application Laid-Open No. 2002-25948, Japanese Patent Application Laid-Open No. H03-166750, and Japanese Patent Application Laid-Open No. H11-26403).

SUMMARY OF THE INVENTION

However, because the thinly processed wafer inevitably becomes fragile, damage is likely to be caused in the wafer during the handling thereof. On the other hand, in the case of stripping the wafer after splitting the wafer from the support, chip is easily to be disordered. If the disorder occurs, the yield of chips that are obtained from the wafer after performing the subsequent steps reduces. Further, the manufacturing process including respective steps of grinding, cutting, and stripping, and is complicated itself.

A method for manufacturing a semiconductor device according to one aspect of invention includes steps of: adhering a support substrate to a first surface of a wafer using an adhesive, the wafer including a first scribe line and a second scribe line demarcating chip regions, the first scribe line extending along a first direction and the second scribe line extending along the second direction crossing the first direction; thinning the wafer adhered to the support substrate; forming a groove in the first scribe line excluding a region located in an outer peripheral portion of the wafer, the groove piercing the wafer from the first surface to a second surface opposite to the first surface to expose the adhesive; and removing the adhesive by immersing the wafer adhered to the support substrate in a solvent such that the solvent permeates into the groove.

A method for manufacturing a semiconductor device according to another aspect of invention includes steps of: adhering a support substrate to a first surface of a wafer using an adhesive, the wafer having a second surface opposite to the first surface; thinning the wafer adhered to the support substrate; forming a through-hole that penetrates the wafer in at least one of scribe lines each extending along a first direction of the wafer and a second direction crossing the first direction to demarcate chip regions; forming a via-hole in a region of the wafer to be formed in a chip; forming a via-wiring on the via-hole; and removing the adhesive by immersing the wafer adhered to the support substrate in a solvent such that the solvent permeates into the through-hole, wherein the step of forming the via-hole and the step of forming the through-hole include etching the wafer from the second surface of the wafer to the first surface of the wafer, the first surface of the wafer having an etching stopper layer in the region where the via-hole is formed and another region where the through-hole is formed.

DESCRIPTION OF THE PREFERRED EMBODIMENTS

First, problems that arise in a method for manufacturing a semiconductor device will be described. In an example of the manufacturing method, a wafer is thinly processed in a state of being fixed to a support substrate or the like. Then, chips are formed by cutting the wafer. After the cutting, an adhesive to bond the wafer to the support substrate is dissolved. Stripping the chips from the support substrate is thereby enabled. However, chip alignment is disordered in the step of dissolution. In particular, if dissolution is performed using a solvent or the like, the chips scatter into the solvent. Because the alignment is disordered, the yield of chips reduces in the subsequent steps.

Figure 1A:
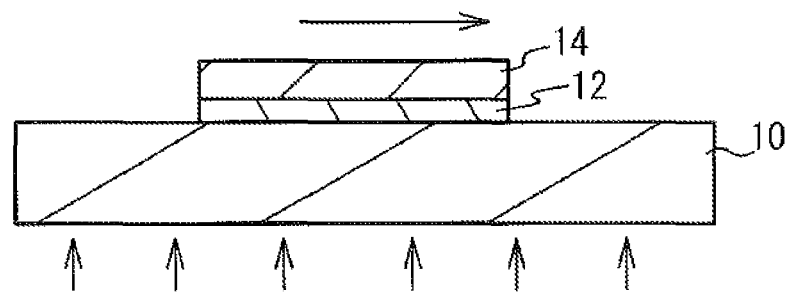
FIGS. 1A and 1B are sectional views exemplifying a method for manufacturing a semiconductor device according to a comparable example.
Figure 1B:
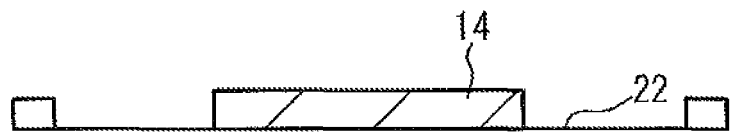

In another example of the manufacturing method, wafer cutting is performed after stripping the wafer from the support substrate. Description will be given of, as a comparable example, an example of stripping the wafer by a thermal stripping method. FIG. 1A and FIG. 1B are sectional views exemplifying a method for manufacturing a semiconductor device according to the comparable example. As shown in FIG. 1A, a wafer 14 is adhered to a support substrate 10 using a wax 12. The wafer 14 is thinned by grinding from a back surface thereof. As shown by the upward arrows in FIG. 1A, the wax 12 is melted by heating the support substrate 10. For example, a hot plate or the like is used to heat the wax 12 to approximately 150° C. By sliding the wafer 14 on the support substrate 10 as shown by the sideways arrow in FIG. 1A, the wafer 14 is stripped from the support substrate 10. After washing the wafer 14 by an organic solvent or the like, as shown in FIG. 1B, the wafer 14 is adhered to a dicing tape 22, and the wafer 14 is then cut by dicing.

In the comparable example, cracks may be induced in the wafer 14 due to a stress caused during the thermal stripping. In particular, because the wafer 14 is low-profiled, the wafer 14 is likely to be damaged. Until the wafer 14 is adhered to the dicing tape after being stripped from the support substrate 10, the single wafer 14 without any supports is handled. Therefore, the wafer 14 is likely to be damaged. Also, because the wafer 14 is slid on the support substrate 10, the wafer 14 is scratched on its front surface.

Embodiments of the present invention will be described by enumeration.

An embodiment of the present invention is a method for manufacturing a semiconductor device that including: adhering a support substrate to a first surface of a wafer using an adhesive; thinning a wafer adhered to the support substrate; forming a groove that pierces the wafer in a scribe line excluding a region located in an outer peripheral portion of the wafer, the scribe line including plural lines each extending along the first direction and another direction crossing the first direction to demarcate chip regions, and the groove extending along at least one directions of the scribe line; and removing the adhesive by immersing the wafer adhered to the support substrate in a solvent such that the solvent permeates into the groove.

According to the present embodiment, the adhesive may be removed by the solvent that permeates from the groove but the wafer is still supported by the support substrate. Consequently, damage to the wafer may be suppressed. Even if a groove is formed in the scribe line along the first direction, because the outer peripheral portion is left in no grooves, chip connections are maintained. Because the disorder of the chip alignment is prevented even after the adhesive is removed, the reduction of the yield of chips is suppressed. Because the groove formed along the first direction of the scribe line is used for dividing the wafer, the step is simplified. Thus, a method for manufacturing a semiconductor device capable of suppressing damage to a wafer and reduction in the yield of chips and capable of simplifying the process may be provided.

In the above-described embodiment, the method for manufacturing a semiconductor device may include removing the wafer from the support substrate after fixing a support member to a second surface of the wafer on a side opposite to the first surface, and cutting the wafer along a second scribe line extending in the second direction crossing the first direction. According to the present embodiment, because the adhesive is removed and the wafer is fixed to the support member and removed from the support substrate, the reduction in the yield of chips may be suppressed. The groove formed along the first direction of the scribe line is used for dividing the wafer. Because the wafer is necessary to be diced only along the second direction of the scribe line, the step is simplified.

In the above-described embodiment, the formation a groove and that of individual chips may include laser-dicing the wafer or dry-etching the wafer. According to the present embodiment, the wafer may have a smaller cutting allowance. Consequently, the number of chips to be formed is enhanced, so that the semiconductor device is reduced in cost.

An embodiment of the present invention is a method for manufacturing a semiconductor device that including: adhering a support substrate to a first surface of a wafer using an adhesive; thinning a wafer adhered to the support substrate; forming a through-hole that pierces the wafer in at least some of scribe lines each extending along a first direction of the wafer or a second direction crossing the first direction to demarcate chip regions; forming a via-hole in a region to be a chip out of the wafer concurrently with the formation of the through-hole; forming a via-wiring on the via-hole; and removing the adhesive by immersing the wafer adhered to the support substrate in a solvent such that the solvent permeates into the through-hole; where the formation of a via-hole and that of a through-hole may be performed by etching the wafer from a second surface of the wafer to a first surface of the wafer opposite to the second surface, the first surface having an etching stopper layer in the region in which a via-hole is formed and the region in which a through-hole is formed, finally, the etching stopper layer of the region in which a through-hole is formed is removed.

According to the present embodiment, the adhesive may be dissolved by the solvent that permeates from the through-hole, but the wafer is left to be supported by the support substrate and an adhesive such as wax. Consequently, damage to the wafer may be suppressed. Because the connection between the chips is maintained even if the through-hole is formed, the disorder of chip alignment may be suppressed. Even after the through-hole is formed, the reduction of the yield of chips may be suppressed. Because the via-hole and the through-hole are formed by one time of etching, the step is simplified. Thus, a method for manufacturing a semiconductor device capable of suppressing damage to a wafer and the reduction of the yield of chips and capable of simplifying the process can be provided.

In the above-described embodiment, the method for manufacturing a semiconductor device may include removing the wafer from the support substrate after fixing a support member to the second surface of the wafer on a side opposite to the first surface, and dicing the wafer along the scribe line. According to the present embodiment, because the adhesive is removed but the wafer is still fixed to the support member and removed from the support substrate, the reduction of the yield of chips may be suppressed. Also, because the through-hole is formed in the scribe line, the wafer may be easily diced.

In the above-described embodiment, the through-hole and the via-hole may have the size same with others. According to the embodiment, because the through-hole and the via-hole may be processed under the same conditions, the process is simplified.

In the above-described embodiment, a plurality of the through-holes may be formed in each of a plurality of the scribe lines. According to the present embodiment, because the solvent spreads throughout the adhesive, the adhesive may be efficiently removed.

In the above-described embodiment, the cur of a wafer may be carried out by breaking the wafer along the scribe line. According to the present embodiment, the wafer may be easily broken. Also, dicing may be unnecessary to break the wafer. Because the dicing becomes unnecessary, the semiconductor device may be reduced in cost.

In the above-described embodiment, the wafer may include a silicon carbide substrate and a nitride semiconductor layers provided on the silicon carbide substrate. According to the present embodiment, because the thinned wafer is supported by the support substrate, damage induced in the wafer may be suppressed.

In the above-described embodiment, the etching stopper layer in the region in which the via-hole is formed and the etching stopper layer in the region in which the through-hole is formed may be formed in respective steps independent of the others.

Hereinafter, examples of the present invention will be described.

Example 1

Figure 3A:
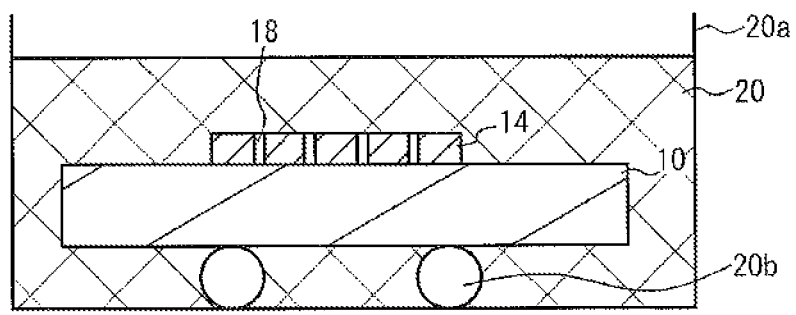
FIGS. 3A to 3E are sectional views exemplifying a method, subsequent to that shown in FIG. 2C, for manufacturing a semiconductor device according to Example 1.
Figure 4A:
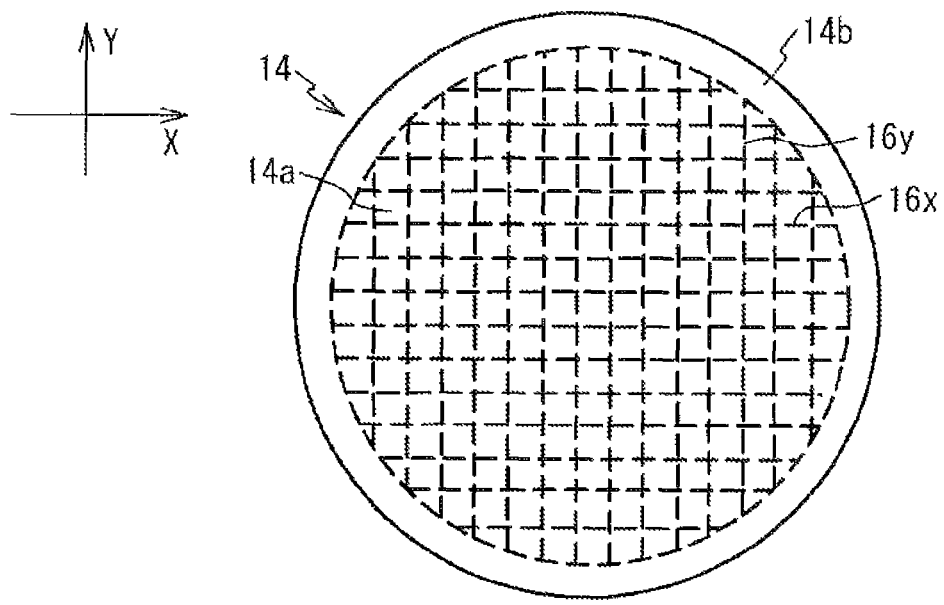
FIGS. 4A and 4B are plan views exemplifying a wafer before formation of grooves and after grooves are formed, respectively.
Figure 4B:
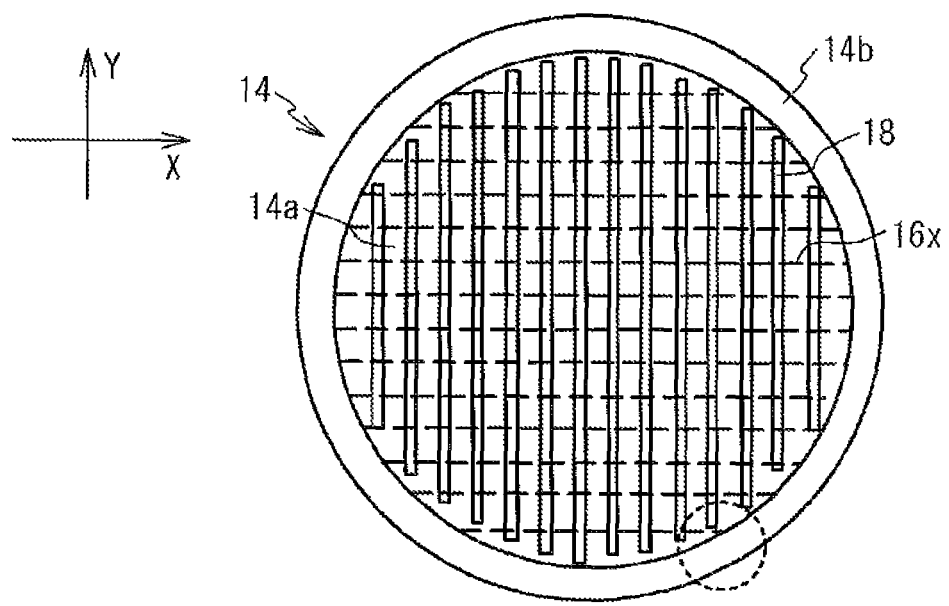
Figure 5A:
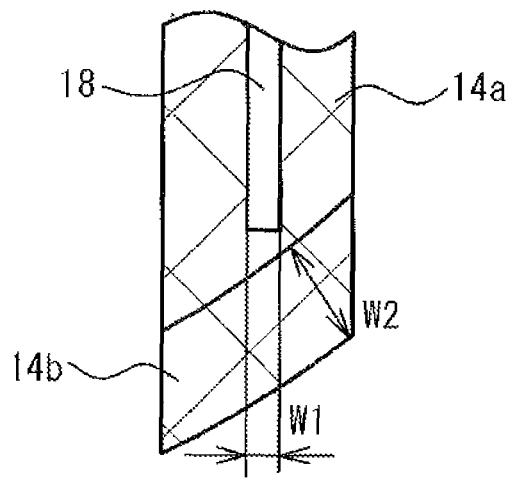
FIG. 5A is a view magnifying a part of FIG. 4B
Figure 5B:
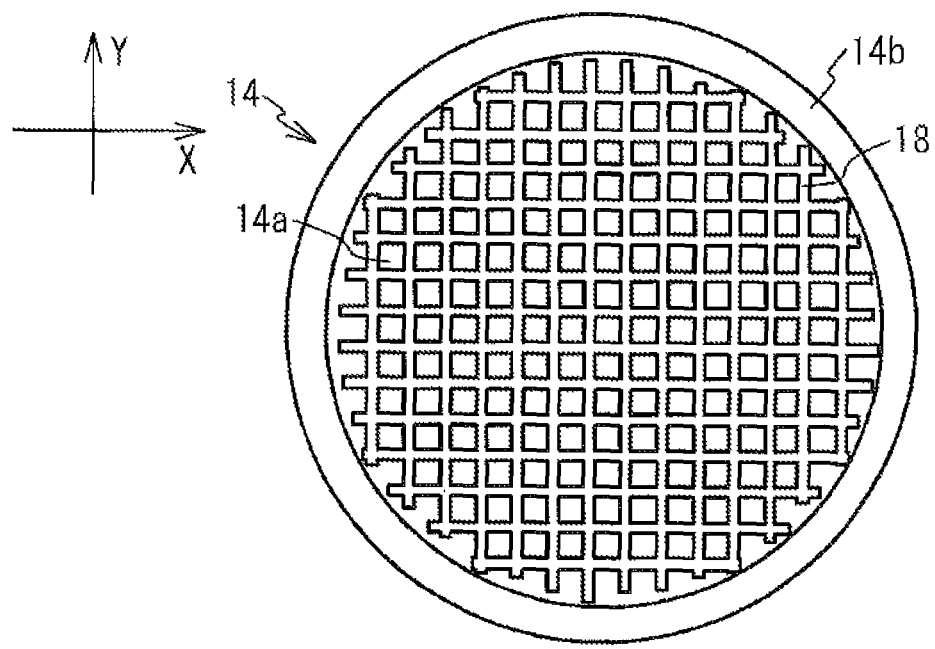
FIG. 5B is a plan view exemplifying a wafer after dicing into chips.

FIG. 2A to FIG. 3E are sectional views exemplifying a method for manufacturing a semiconductor device according to Example 1. FIG. 4A is a plan view exemplifying a wafer 14 before formation of the grooves 18. FIG. 4B is a plan view exemplifying the wafer 14 after the grooves 18 are formed. FIG. 5A is a view magnifying a part encircled by a dashed line in FIG. 4B. FIG. 5B is a plan view exemplifying the wafer 14 after being diced into respective chips 14*a*.

Figure 2A:
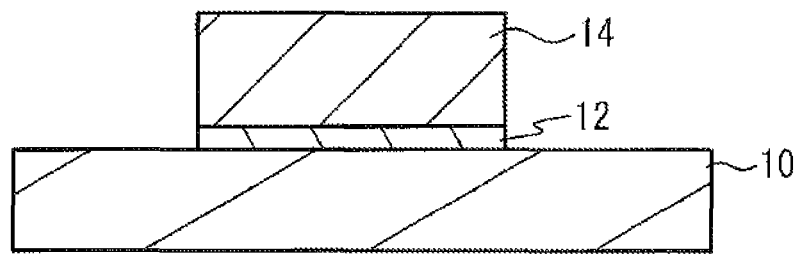
FIGS. 2A to 2C are sectional views exemplifying a method for manufacturing a semiconductor device according to Example 1.

As shown in FIG. 2A, a support substrate 10 is adhered to a front surface (first surface, lower surface in FIG. 2A) of the wafer 14 using a wax 12 (adhesive). The support substrate 10 may be made of, for example, glass or the like. As to be described later regarding to Example 2, the wafer 14 includes a SiC substrate and a nitride semiconductor layers. The nitride semiconductor layer includes a GaN layer, and comprises transistors such as FETs (Field Effect Transistors). The wafer 14 is disposed such that the nitride semiconductor layer of the wafer 14 faces the support substrate 10 and the SiC substrate exposes. As shown in FIG. 4A, the wafer 14 includes a plurality of chips 14a. Also, the wafer 14 is formed with a plurality of scribe lines 16. Among the scribe lines 16, some of them extending along the Y-direction shown by the arrow in FIG. 4A are provided as first scribe lines 16y. Also, rest of the scribe lines 16 extending along the X-direction crossing the Y-direction are provided as second scribe lines 16x. The scribe lines 16 demarcate the chips 14a.

Figure 2B:
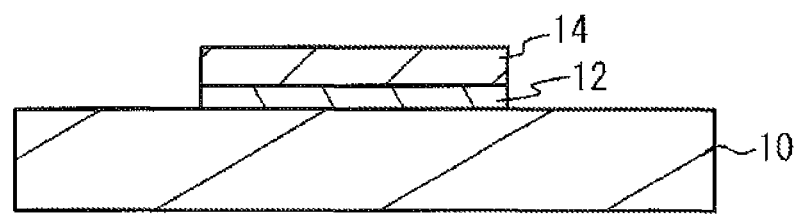

As shown in FIG. 2B, grinding of a back surface (second surface, upper surface in FIG. 2B) of the wafer 14 are performed. By the grinding, the wafer 14 is thinned to a thickness of, for example, 150 μm or less. The SiC substrate is ground at the preset process, but the nitride semiconductor layer is not ground. The wafer 14 may be thinned by polishing, instead of grinding. The back surface processing of the wafer 14 is, for example, formation of an electrode (not shown) and the like.

As shown in FIG. 4B, the wafer 14 is processed from the back surface of the wafer 14 along the scribe lines 16y by, for example, laser dicing, dry etching, or the like. Grooves 18 that piercing the wafer 14 from the back surface to the front surface are thereby formed in the wafer 14. The grooves 18 are formed in the scribe lines 16y extending along the Y-direction, but are not formed in the scribe lines 16x extending along the X-direction. Also, the wafer 14 is not processed in an outer peripheral portion 14b thereof. Accordingly, the connection between the chips 14a and that in the outer peripheral portion 14b are maintained. Because the chips 14a are not separated the reduction of the yield of the chips 14a is suppressed in the subsequent steps. As shown in FIG. 5A, the width W1 of the groove 18 is, for example, 20 μm. The width W2 of the outer peripheral portion 14b is, for example, 2 mm. For maintaining the strength of the wafer 14, the width W2 is preferably 2 mm or more.

Figure 2C:
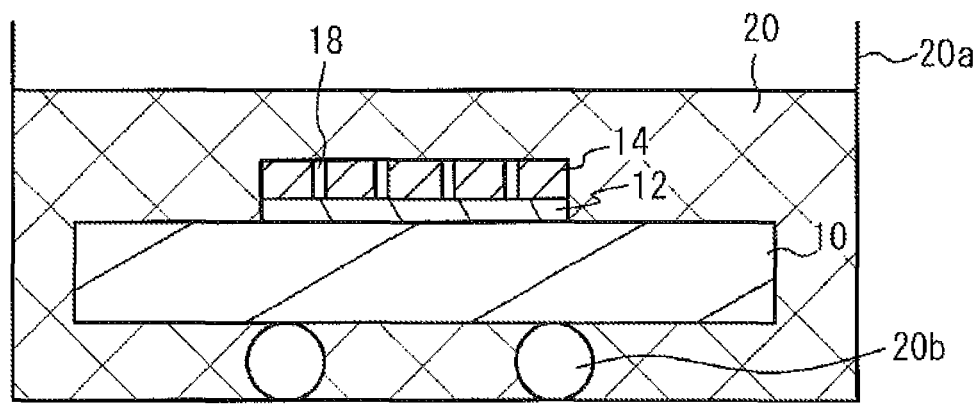

As shown in FIG. 2C, the support substrate 10 and the wafer 14 are charged in a tank 20a in which an organic solvent 20 is retained. After the support substrate 10 is mounted on jigs 20b, the support substrate 10 and the wafer 14 are immersed in the organic solvent 20. Due to permeation of the organic solvent 20 from the grooves 18, the organic solvent 20 reaches the wax 12. As shown in FIG. 3A, the wax 12 is dissolved by the organic solvent 20. The organic solvent 20 is, for example, an alcohol such as acetone, pyrolidone, or isopropyl alcohol (IPA) or the like. The time of immersion into the organic solvent 20 is, for example, 30 minutes to 60 minutes.

Figure 3B:
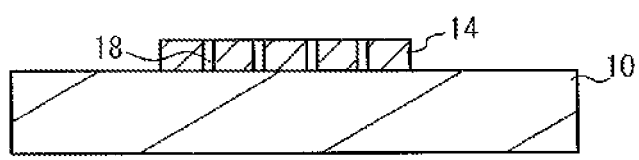
Figure 3C:
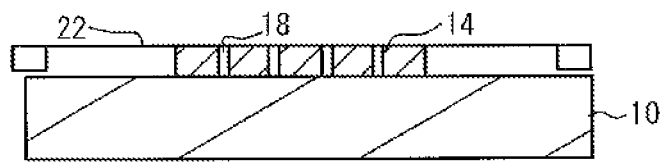
Figure 3D:
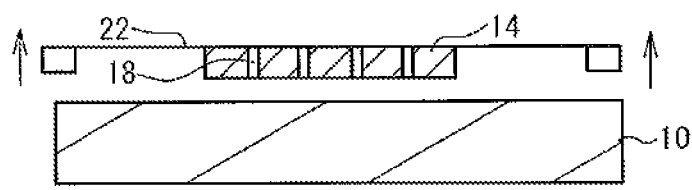
Figure 3E:

As shown in FIG. 3B, the support substrate 10 and the wafer 14 are taken out of the tank 20a, and are then dried. As shown in FIG. 3C, a dicing tape 22 (support member) is adhered to the back surface of the wafer 14. As shown in FIG. 3D, by lifting the wafer 14 together with the dicing tape 22, the wafer 14 is stripped from the support substrate 10. Because the wax 12 has been dissolved, stripping the wafer 14 is possible. As shown in FIG. 3E, the front surface of the wafer 14 is exposed.

The wafer 14 is cut from the front surface (upper surface in FIG. 3E). As shown in FIG. 5B, the wafer 14 is cut along the scribe lines 16x by, for example, laser dicing, dry etching, or the like. Chips 14a diced from the wafer 14 are formed by the processes above described. In addition, the cuter peripheral portion 14b may be cut or may not be cut.

According to Example 1, the wax 12 can be dissolved by an organic solvent that permeates from the groove 18. Example 1 does not need to heat the wafer 14 as that of the comparable example. Consequently, according to Example 1, damage induced to the wafer 14 due to heat treatment is suppressed. For suppressing damage to the wafer 14, it is preferable not to handle the wafer 14. In Example 1, because the wafer 14 is supported by the support substrate 10 and the dicing tape 22, damage to the wafer 14 is suppressed. In order to support the wafer 14 after being stripped from the support substrate 10, other support members except for the dicing tape 22 may be used. By lifting the wafer 14 together with the dicing tape 22, the wafer 14 is stripped from the support substrate 10. Because the wafer 14 is not slid on the support substrate 10, the wafer 14 is unlikely to be scratched on the front surface thereof.

Because the grooves 18 are formed in the scribe lines 16y, the step is simplified. That is, in the step of dicing, only the scribe lines 16x is left to be diced. In other words, the dicing along the scribe lines 16y is unnecessary. Because the number of scribe lines may be reduced compared with a case where the wafer 14 is diced along all scribe lines 16, the processing time is reduced. A reduction in the cost of the semiconductor device is therefore possible. Also, the organic solvent spreads throughout the wax 12 through the scribe lines 16y. The wax 12 can thereby be efficiently dissolved. For example, even if the grooves 18 are formed in some of the plurality of the scribe lines 16y and are not formed in rest of the scribble lines 16y, it is possible to dissolve the wax 12, which may simplify the process. That is, the grooves 18 may be formed only in some of the plurality of the scribe lines 16. However, for further simplifying the process and efficiently dissolving the wax 12, it is preferable to form the grooves 18 in respective scribe lines 16y. Alternatively, the grooves 18 may be formed in respective scribe lines 16x but not formed in the scribe lines 16y.

A smaller tolerance is necessary in the laser dicing or dry etching to form the grooves 18 and dice the wafer 14 compared with the dicing using a blade. The tolerance is necessary, for example, 50 μm to 60 μm in the blade dicing. Thus, a width of the scribe line 16 is necessary to be, for example, approximately 100 μm added with the tolerance. On the other hand, in the laser dicing or the dry etching, the tolerance may be set to, for example, 20, and the width of the scribe line 16 may be set to 50 μm to 60 μm. Narrowed scribe lines result in an increase in the number of chips 14a to be obtained from one wafer 14. Consequently, the semiconductor device may be reduced in the cost.

Example 2

A method for manufacturing a semiconductor device according to Example 2 will be described. FIG. 6A to FIG. 7D are enlarged sectional views exemplifying a method for manufacturing a semiconductor device according to Example 2. FIG. 8A is an enlarged plan view exemplifying a wafer 14 after formation of the through-holes 34 and the via-holes 32. FIG. 83 is an enlarged plan view exemplifying the wafer 14 after dicing. The steps of adhesion and grinding shown in FIG. 2A and FIG. 2B are also per formed in Example 2. Here, a description will be given with reference to enlarged sectional views.

Figure 6A:
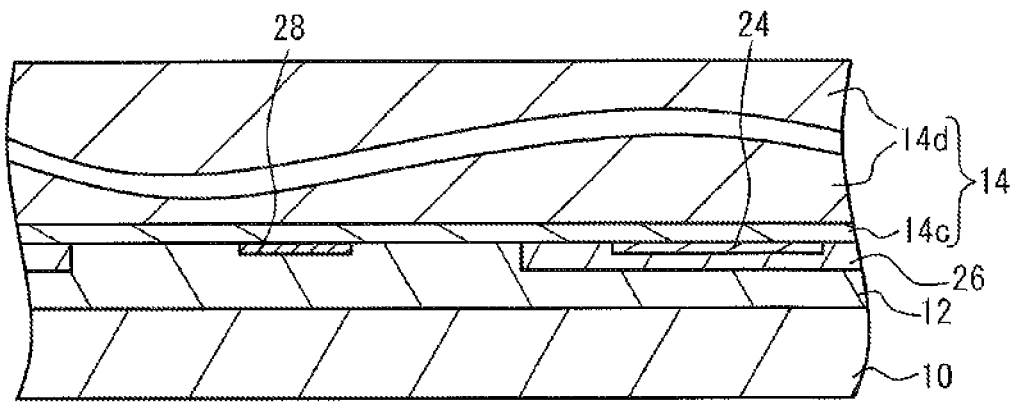
FIGS. 6A to 6C enlarged sectional views exemplifying a method for manufacturing a semiconductor device according to Example 2.

As shown in FIG. 6A, the wafer 14 is disposed such that a nitride semiconductor layer 14c is in the lower side and a SiC substrate 14d is in the upper side. A pad 24, an insulating film 26, and an etching stopper layer 28 are provided on a lower surface of the nitride semiconductor layer 14c. The pad 24 is formed by stacking, for example, a nickel (Ni) layer having a thickness of a few hundred nanometers and a gold (Au) layer having a thickness of 5 from the side close to the wafer 14. The insulating film 26 is made of, for example, silicon nitride (SiN) having a thickness of 1 μm. The insulating film 26 covers the pad 24. The etching stopper layer 28 is made of, for example, Ni. The wafer 14 is adhered to the support substrate 10 such that the nitride semiconductor layer 14c faces the support substrate 10. Also, the pad 24 and the etching stopper layer 28 may be formed in respective steps independent to the other.

Figure 6B:
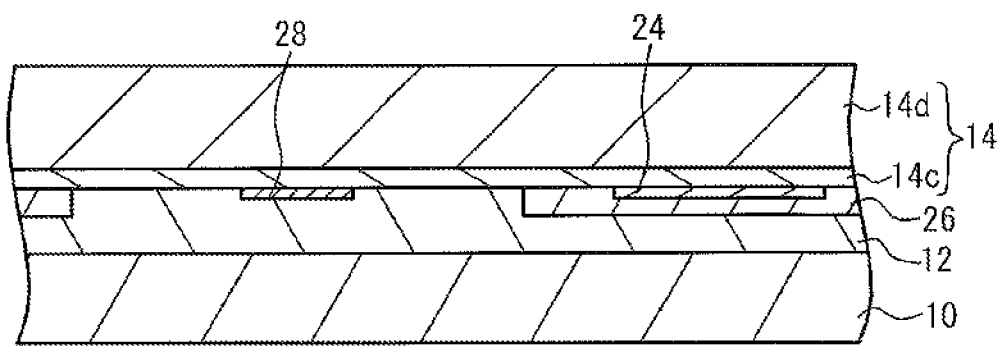
Figure 6C:
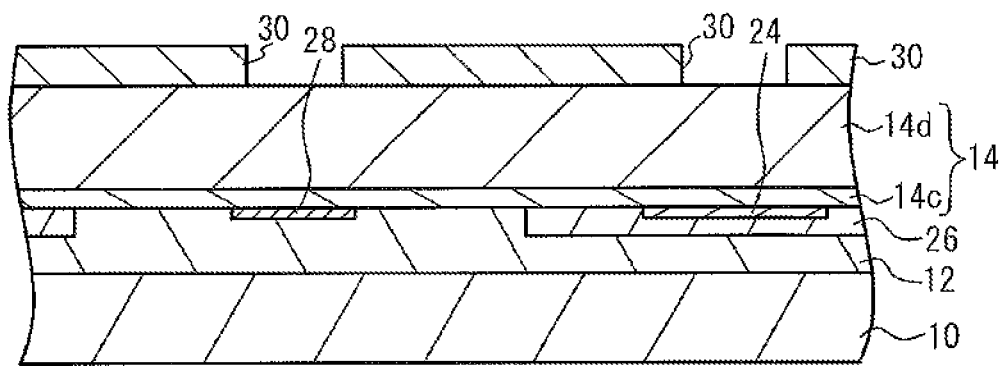

As shown in FIG. 6B, the wafer 14 is thinned by grinding the SiC substrate 14d. As shown in FIG. 6C, a mask 30 made of, for example, Ni or the like is formed on the back surface of the wafer 14. A portion of the wafer 14 is exposed within the opening of the mask 30.

Figure 7A:
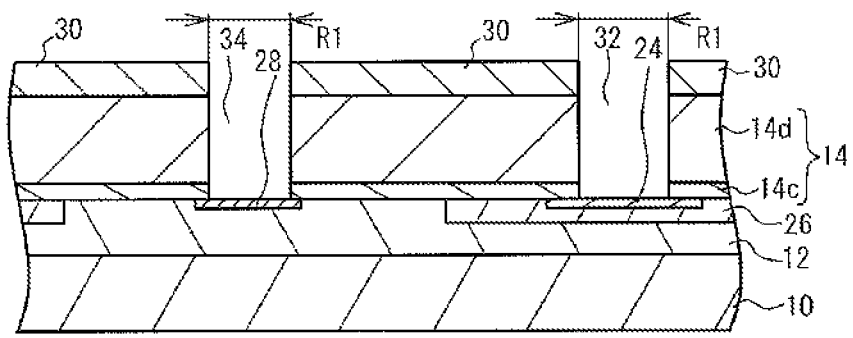
FIGS. 7A to 7D are enlarged sectional views exemplifying a method for manufacturing a semiconductor device according to Example 2.
Figure 8A:
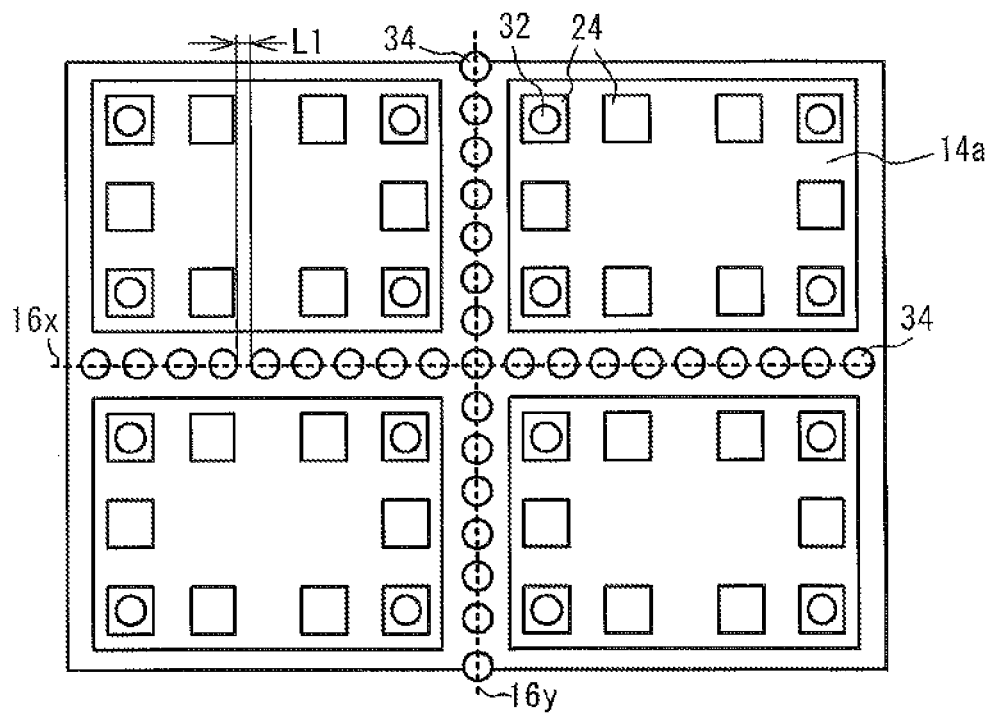
FIGS. 8A and 8B are enlarged plan views exemplifying a wafer after formation of through-holes and via-holes, and after dicing.
Figure 8B:
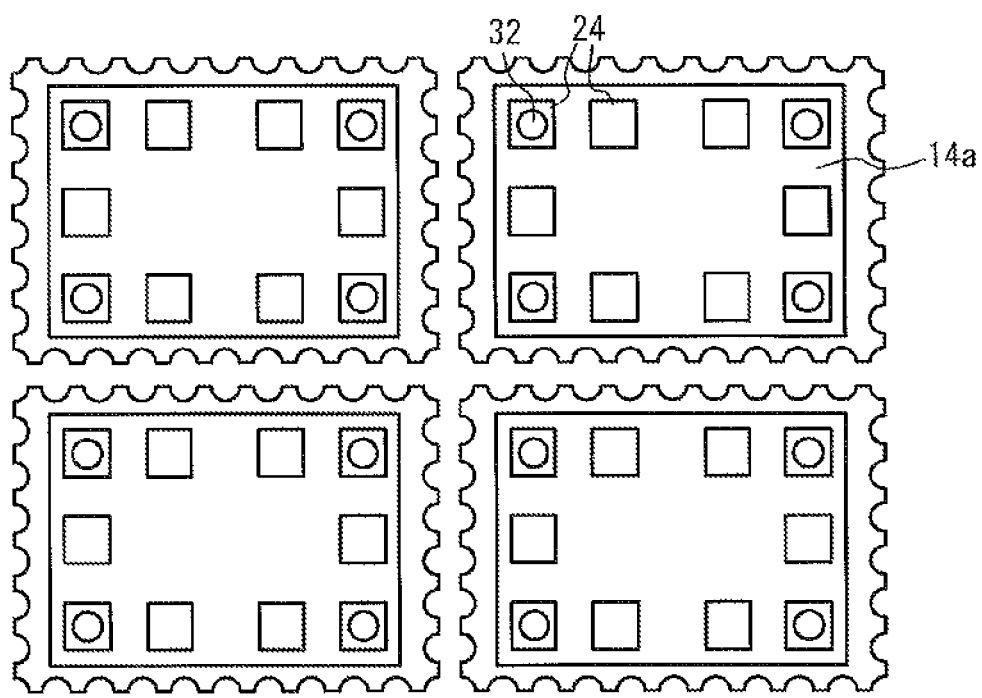

As shown in FIG. 7A, a via-hole 32 and a through-hole 34 are formed in the wafer 14 by dry-etching. A fluorine-based gas such as, for example, sulfur hexafluoride ($SF_6$), carbon tetrafluoride ($CF_4$), or trifluoromethane ($CHF_3$) is used as the etching gas. The etching of the semiconductor materials, 14c and 14d, stops at the pads 24 and the etching stopper layer 28. That is, the through-hole 34 reaches the etching stopper layer 28. The via-hole 32 reaches the pad 24. The diameter R1 of the via-hole 32 and that of the through-hole 34 is, for example, 20. As shown in FIG. 8A, a plurality of through-holes 34 are formed within the scribe lines 16x and 16y (dashed lines in the figure). The distance L1 between the through-holes 34 is, for example, 10 to 50 μm.

Figure 7B:
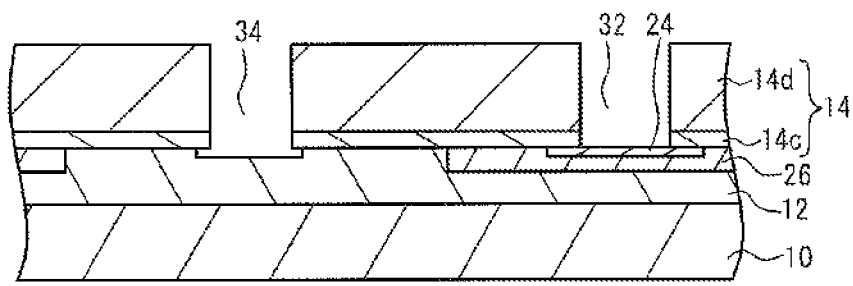
Figure 7C:
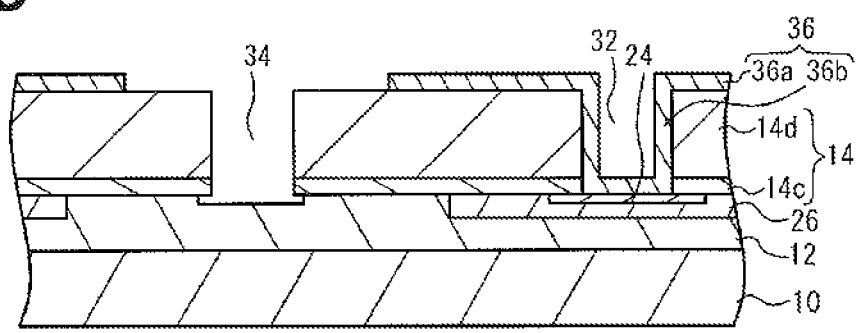

As shown in FIG. 7B, the etching stopper layer 28 and the mask 30 are removed by, for example, etching or the like. As shown in FIG. 7C, a conductive layer 36 is formed by, for example, plating or the like. The conductive layer 36 includes a wiring 36a formed on the back surface of the wafer 14 and a via-wiring 36b formed in the via-hole 32. The via-wiring 36b is in contact with the pad 24. The conductive layer 36 is made of, for example, a stack of a nickel layer and an Au layer.

Figure 7D:
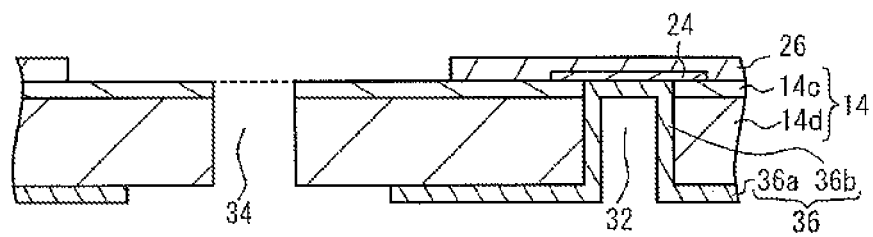

Similar to the example of FIG. 2C, the support substrate 10 and the wafer 14 are immersed within the organic solvent 20. Due to permeation of the organic solvent from the through-hole 34 shown in FIG. 7C, the wax 12 is dissolved. As shown in FIG. 7D, the wafer 14 is stripped from the support substrate 10. At this time, similar to FIG. 3D, a dicing tape 22 can be used. As shown in FIG. 83, the wafer 14 is split by breaking or dicing.

According to Example 2, the wax 12 can be dissolved by an organic solvent that permeates from the through-holes 34. Also, the wafer 14 is supported by the support substrate 10 or the dicing tape 22. Therefore, damage to be induced in the wafer 14 may be suppressed. The wafer 14 is not slid, and is thus unlikely to be scratched in the front surface thereof. Also, as shown in FIG. 8A, because the connection between the chips 14a is maintained even after the through-holes 34 are provided, the reduction of the yield of the chips 14a may be suppressed.

Because the via-holes 32 and the through-holes 34 are concurrently formed by etching the semiconductor materials, 14c and 14d, the process may be simplified compared with a case where the via-holes 32 and the through-holes 34 are independently formed by a plural etchings. In addition, the formation of the via-holes 32 and the through-holes 34 may accompany with, or not, the formation of the via-holes and the through-holes in the outer peripheral portion 14b.

For stabilizing the etching rate, the via-holes 32 and the through-holes 34 preferably have the same diameter. Under such a condition, Etching on the scribe line 16 and etching on the chip 14a proceed equally and suppress the over-etching of the wafer 14, while forming the via-holes 32 and the through-holes 34 having a desired diameter. Also, because it is unnecessary to differentiate etching conditions between the via-holes 32 and the through-holes 34, the process is simplified. The via-holes 32 and the through-holes 34 may be differentiated in diameter. However, when the diameter of the through-holes 34 is different from that of the via-holes 32, the over-etching is likely to be occurred. For example, when the diameter of the though-holes 34 is larger than that of the via-holes 32; the semiconductor materials, 14c and 14d, within the chips 14a are sometimes over-etched, so that via-holes 32 having the desired diameter are not obtained. Also, the etching may proceed evenly to the pads 24 and the support substrate 10 under the wafer 14. The via-holes 32 and the through-holes 34 may be formed by the wet-etching.

In addition, the via-holes 32 and the through-holes 34 may be formed by the laser drilling. The via-holes 32 and the through-holes 34 having the diameters same with others may be formed by the laser conditions same with the other. The process may be therefore simplified. Even when the via-holes 32 and the through-holes 34 have sectional shapes other than a circular shape, the via-holes 32 and the through-holes 34 preferably have the same size.

Because the etching stopper layer 28 is provided on the wafer 14, the over-etching of the wafer 14 and the wax 12 is suppressed in the dry-etching to form the through-holes 34. when the wafer 14 is over-etched, an element portion (FETs, etc.) of the wafer 14 is also sometimes etched. Also, for example, when the wax 12 is etched, the wafer 14 is stripped from the support substrate 10. Particularly, because the SiC substrate 14d has extreme hardness, the dry-etching becomes tough enough. By providing the etching stopper layer 28, the over-etching may be suppressed even when the etching conditions become tough. The etching stopper layer 28 is preferably made of the same material as that of the mask 30 such as Ni. The etching stopper layer 28 and the mask 30 may be removed by the same step.

A plurality of the through-holes 34 are preferably formed in the scribe lines 16. Particularly, a plurality of the through-holes 34 are preferably formed in each of the plurality of scribe lines, 16x and 16y. An organic solvent may be spread throughout the wax 12 to efficiently dissolve the wax 12. For example, the through-holes 34 may be provided in only either of the scribe lines 16x and 16y. One through-hole 34 may be provided per one scribe line 16.

Because the plurality of the through-holes 34 are formed in the scribe lines 16, the strength of the wafer 14 in the scribe lines 16 reduces compared with that of a region other than the scribe lines 16. Therefore, the breaking and the dicing become easy. When the wafer 14 is split by the breaking, the dicing becomes unnecessary. The semiconductor device is reduced in the cost thereof.

The substrate may be made of sapphire or silicon (Si) in place of the SiC substrate 14d. The wafer 14 may include arsenic semiconductor materials such as gallium arsenide (GaAs), besides the nitride semiconductor layer 14c. The wafer 14 including the SiC substrate 14d and the nitride semiconductor layer 14c has extreme hardness, and is thus unlikely to be damaged.

The support substrate 10 may be made of a material other than glass, and is particularly preferably made of a material having excellent hardness. This is for suppressing damage to the support substrate 10 in the grinding. Also, the bonding force between the wafer 14 and the support substrate 10 by the wax 12 is preferably large. This is for fixing the wafer 14 rigidly in the grinding. For stripping the wafer 14 from the support substrate 10, a support member other than the dicing tape 22 may be used. Conditions necessary in the support member are to fix the wafer 14 and strip the chips 14a after the wafer 14 is braked. The support member may have, for example, a property that the bonding force may be reduced by irradiating ultraviolet rays. Also, the support member may be a member to bond the wafer 14 and may be a member to suck the same. The chips 14a may be preferably stripped from the support member without using a solvent. This is for suppressing the chips 14a from scattering into the solvent. The support substrate 10 preferably has hardness exceeding that of the support member such as the dicing tape 22. Also, the bonding force between the wax 12 and the wafer 14 is preferably stronger than the bonding force between the support member and the wafer 14.

An adhesive other than the wax 12 may be used for bonding of the wafer 14 with the support substrate 10. As the solvent, only a condition to be dissolved by an organic solvent is required. For example, an organic adhesive may be dissolved by an organic solvent. The solvent may be an inorganic solvent.

It should be noted that the present invention is not limited to such specific embodiments and examples and can be variously modified and changed within the gist of the present invention described in the scope of claims.

What is claimed is:

1. A method for manufacturing a semiconductor device, the method comprising steps of:
    adhering a support substrate to a first surface of a wafer using an adhesive, the wafer including a first scribe line and a second scribe line demarcating chip regions, the first scribe line extending along a first direction and the second scribe line extending along a second direction crossing the first direction;
    thinning the wafer adhered to the support substrate;
    forming a groove in the first scribe line excluding a region located in an outer peripheral portion of the wafer, the groove piercing the wafer from a second surface to the first surface to expose the adhesive, the second surface being opposite to the first surface; and
    removing the adhesive by immersing the wafer adhered to the support substrate in a solvent such that the solvent permeates into the groove.

2. The method for manufacturing the semiconductor device according to claim 1, further comprising steps of:
    fixing a support member to the second surface of the wafer;
    splitting the wafer from the support substrate; and
    breaking the wafer along the second scribe line.

3. The method for manufacturing the semiconductor device according to claim 2, wherein the step of forming the groove and the step of breaking the wafer are carried out by laser-dicing the wafer or dry-etching the wafer.

4. The method for manufacturing the semiconductor device according to claim 1, wherein the wafer includes a substrate made of a silicon carbide (SiC) and a semiconductor layer made of a nitride semiconductor material provided on the substrate.

5. A method for manufacturing a semiconductor device, the method comprising:
    adhering a support substrate to a first surface of a wafer using an adhesive, the wafer having a second surface opposite to the first surface;
    thinning the wafer adhered to the support substrate;
    forming a through-hole that penetrates the wafer in at least one of a scribe lines each extending along a first direction of the wafer or a second direction crossing the first direction to demarcate chip regions;
    forming a via-hole in a region of the wafer to be formed in a chip;
    forming a via-wiring on the via-hole; and
    removing the adhesive by immersing the wafer adhered to the support substrate in a solvent such that the solvent permeates into the through-hole,
    wherein the step of forming the via-hole and the step of forming the through-hole include etching the wafer from the second surface of the wafer to the first surface of the wafer, the first surface of the wafer having an etching stopper layer in the region where the via-hole is formed and another region where the through-hole is formed.

6. The method for manufacturing the semiconductor device according to claim 5, further comprising a step of, after forming the through-holes, removing the etching stopper layer of the region in which the through-hole is formed.

7. The method for manufacturing the semiconductor device according to claim 5, further comprising steps of:
    fixing a support member to the second surface of the wafer;
    splitting the wafer from the support substrate; and
    breaking the wafer along the scribe line.

8. The method of manufacturing the semiconductor device according to claim 5, wherein the step of forming the through-hole and the via-hole are performed in a same time.

9. The method for manufacturing the semiconductor device according to claim 5, wherein the step of breaking the wafer includes a step of breaking the wafer along the scribe line.

10. The method for manufacturing the semiconductor device according to claim 8, wherein the step of forming the through-hole and the via-hole includes a step to form the through-hole and the via-hole in a same size.

11. The method for manufacturing the semiconductor device according to claim 5, wherein the step of forming the through-hole includes a step to form a plurality of the through-holes in the respective scribe lines.

12. The method for manufacturing the semiconductor device according to claim 5, further comprising a step of, in advance to the step of adhering the support substrate on the first surface of the wafer, forming the etching stopper layer of the region in which the via-hole is formed and the etching stopper layer of the region in which the through-hole is formed independently in separate steps.

* * * * *